(12) United States Patent
Nabe et al.

(10) Patent No.: US 8,455,969 B2
(45) Date of Patent: Jun. 4, 2013

(54) SEMICONDUCTOR DEVICE AND METHOD FOR MANUFACTURING THE SAME

(75) Inventors: Yoshihiro Nabe, Tokyo (JP); Masaki Hatano, Kanagawa (JP); Hiroshi Asami, Shizuoka (JP); Akihiro Morimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 963 days.

(21) Appl. No.: 12/078,894

(22) Filed: Apr. 8, 2008

(65) Prior Publication Data

US 2008/0283951 A1    Nov. 20, 2008

(30) Foreign Application Priority Data

May 16, 2007   (JP) ................. 2007-130354

(51) Int. Cl.
  *H01L 31/00*   (2006.01)
  *H01L 21/00*   (2006.01)
(52) U.S. Cl.
  USPC .... 257/433; 257/774; 257/295; 257/E31.124; 257/E21.476
(58) Field of Classification Search
  USPC ............. 257/433, 774, E31.124, 21.476, 257/295 E, E21.476, 295
  See application file for complete search history.

(56) References Cited

U.S. PATENT DOCUMENTS

| | | | | |
|---|---|---|---|---|
| 7,582,556 | B2 * | 9/2009 | Lin et al. | 438/626 |
| 7,781,284 | B2 * | 8/2010 | Sashida | 438/239 |
| 2010/0225006 | A1 * | 9/2010 | Haba et al. | 257/774 |

FOREIGN PATENT DOCUMENTS

| | | |
|---|---|---|
| JP | 10-242284 | 9/1998 |
| JP | 2000-353800 | 12/2000 |
| JP | 2004-186651 | 7/2004 |
| JP | 3655232 | 3/2005 |
| JP | 2006-128713 | 5/2006 |
| JP | 2006-229043 | 8/2006 |
| JP | 2006-237594 | 9/2006 |

OTHER PUBLICATIONS

Japanese Office Action issued Apr. 14, 2009 for corresponding Japanese Application No. 2007-130354.

* cited by examiner

*Primary Examiner* — Cuong Q Nguyen
*Assistant Examiner* — Cathy N Lam
(74) *Attorney, Agent, or Firm* — Rader, Fishman & Grauer PLLC

(57) ABSTRACT

A semiconductor device includes a semiconductor substrate having a first electronic circuit and a second electronic circuit formed on an active surface, a pad electrode formed on the active surface by being connected to the first electronic circuit and/or the second electronic circuit, a first opening formed to some point along a depth of the semiconductor substrate toward the pad electrode from a surface opposite to the active surface of the semiconductor substrate, a second opening formed so as to reach the pad electrode from a bottom surface of the first opening, an insulating layer formed by covering sidewall surfaces of the first opening and the second opening, a conductive layer formed by covering at least an inner wall surface of the insulating layer and a bottom surface of the second opening, a third opening formed to some point along the depth of the semiconductor substrate from the surface opposite to the active surface of the semiconductor substrate, and a heat insulator imbedded in the third opening.

22 Claims, 11 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and particularly to a semiconductor device having wires passing through substrate of a device, such as a packaged semiconductor device in which a solid-state imaging device or the like are hermetically sealed, and a method for manufacturing the same.

2. Description of Related Art

As one example of miniaturization of a solid-state imaging device, a method has been disclosed in Japanese Patent Application Publication No. JP 2006-128713 (Patent Document 1), in which an adhesive layer is formed at a peripheral portion outside an imaging element area, and a transparent plate such as glass is disposed on top of the solid-state imaging element, and fixed and sealed by the adhesive layer, to keep the imaging element area airtight.

As a method for extracting an external electrode of the solid-state imaging element, a through opening reaching a pad electrode which is made from aluminum or the like and is disposed on an active surface is formed from a surface opposite to the active surface of the solid-state imaging element by a dry etching method or the like, an insulating layer for keeping insulation from a silicon substrate forming the solid-state imaging element is formed on an inner wall portion of the through opening, and then a conductive layer made from copper or the like allowing electrical connection with the pad electrode, is formed in a manner inner part of the through opening is filled or deposited to a sidewall of the through opening.

In this way, by extracting the external electrode from a back surface of the active surface, packaging of the solid-state imaging device can be realized in the same size as the solid-state imaging element, to enable downsizing of the solid-state imaging device.

Meanwhile, as high-speed, multi-function processing of the solid-state imaging element is pursued, issues are known that heat developed in the solid-state imaging element itself causes heat noise in the solid-state imaging element and a temperature gradient at a pixel section degrades characteristic of shading, or the like.

For example, in many CMOS solid-state imaging elements, peripheral circuits such as an input/output circuit and a comparator are typically arranged around the pixel section, and the temperature gradient occurs at the pixel section due to heat generated by the input/output circuit and the comparator.

For example, during operation at a frame rate of 60 fps, a temperature gradient of 2 degrees occurred at the pixel section due to heat generated at the peripheral circuit section. Such a temperature gradient is increased as frame rate and functions of the peripheral circuits are increased, and at the worst case, imaging characteristics may be greatly affected.

For issues relating to such temperature, a method has been disclosed in Japanese Patent Application Publication No. JP 2000-353800 (Patent Document 2), in which the temperature gradient is made uniform by changing the layout of circuit blocks.

Furthermore, in Japanese Patent Application Publication No. JP 2006-229043 (Patent Document 3), another method has been proposed in which anti-heat measure is taken without use of a cooler by forming a heat-radiating via in a package immediately below an amplifier being a heat generating section of a solid-state imaging element.

Furthermore, in Japanese Patent Publication No. 3655232 (Patent Document 4), still another method has been disclosed in which anti-heat measure is taken by forming grooves for insulating heat from a heat generating section on an active surface side of a solid-state imaging element.

SUMMARY OF THE INVENTION

However, in a semiconductor device according to the Patent Document 1, the conductive layer filling the through opening or deposited on the sidewall of the through opening and the silicon substrate have different thermal expansion coefficients, from which an issue arises that cracks occur on a silicon substrate side from a region near corners between the through opening's bottom and sidewall reaching the pad electrode, due to a heat treatment for curing a resin and for reflow of solder performed after the formation of the conductive layer.

Also, due to thermal expansion by the heat treatment of the conductive layer, the aluminum forming the pad electrode may be pushed up, and from which issues may arise that peelings occur at the boundary between the conductive layer and the pad electrode, and that the pad electrode and the adhesive layer peel off.

The temperature gradient at the pixel section of the solid-state imaging element can be reduced by changing the circuit layout as proposed in Patent Document 2. However, the high-speed and multi-function processing of the solid-state imaging element causes the heating density to vary per each circuit block, thereby making it difficult to solve the issue by the layout change alone.

Furthermore, the technique for improving heat radiation by forming through via in the package substrate such as disclosed in Patent Document 3 has addressed an issue of poor heat radiation efficiency since heat generated at the heat generating section is diffused in the semiconductor element and thereafter carried away to the package substrate.

In addition, the method of bonding the semiconductor element to the package substrate affects the heat transfer efficiency, and a resin that can compatibly realize curing contraction for suppressing warpage and high heat conductivity is expensive, thereby hindering realization of desired heat radiating characteristics.

Furthermore, in the technique for heat-insulating between the heat generating section and the pixel section by forming the grooves on the active surface side of the semiconductor substrate such as disclosed in Patent Document 4, forming of a protective film may, in some cases, be required in order to avoid damaging the active surface during the groove formation.

Accordingly, issues are difficulties, such as cracks and peelings occurring due to differences in the thermal expansion coefficients between the conductive layer to be imbedded in the through opening and the substrate or the pad electrode, and further the difficulty of the temperature gradient in the semiconductor element having regions where heat densities during operation are different, and it is desirable to suppress the difficulties.

In an embodiment of the present invention, there is provided a semiconductor device which includes a semiconductor substrate having a first electronic circuit and a second electronic circuit formed on an active surface, the second electronic circuit having a during-operation heating density different from that of the first electronic circuit, a pad electrode formed on the active surface as connected to the first electronic circuit and/or the second electronic circuit, a first opening formed to some point along a depth of the semiconductor substrate from a surface opposite to the active surface of the semiconductor substrate to the pad electrode, a second opening formed so as to reach the pad electrode from a bottom surface of the first opening and have a diameter smaller than that of the first opening, an insulating layer formed by covering sidewall surfaces of the first opening and the second opening, a conductive layer formed by covering at least an inner wall surface of the insulating layer and a bottom surface of the second opening, on an inner side of the insulating layer, a third opening formed to some point along the depth of the semiconductor substrate from the surface opposite to the active surface of the semiconductor substrate, and a heat insulator imbedded to the third opening.

In the semiconductor device, the first electronic circuit, the second electronic circuit having a during-operation heating density different from that of the first electronic circuit, and the pad electrode are formed on the active surface of the semiconductor substrate. The first opening is formed to some point along the depth of the semiconductor substrate to the pad electrode from the surface opposite to the active surface of the semiconductor substrate. The second opening having a diameter smaller than that of the first opening is formed so as to reach the pad electrode from the bottom surface of the first opening. The insulating layer is formed by covering the sidewall surfaces of the first opening and the second opening. The conductive layer is formed by covering at least the inner wall surface of the insulating layer and the bottom surface of the second opening, on the inner side of the insulating layer. Furthermore, the third opening is formed to some point along the depth of the semiconductor substrate from the surface opposite to the active surface of the semiconductor substrate. The heat insulator is formed by being imbedded in the third opening.

In an embodiment of the present invention, there is provided a semiconductor device which includes a semiconductor substrate having a first electronic circuit and a second electronic circuit formed on an active surface, the second electronic circuit having a during-operation heating density different from that of the first electronic circuit, a pad electrode formed on the active surface by being connected to the first electronic circuit and/or the second electronic circuit, a first opening formed to some point along a depth of the semiconductor substrate toward the pad electrode from a surface opposite to the active surface of the semiconductor substrate, a second opening formed so as to reach the pad electrode from a bottom surface of the first opening and having a diameter smaller than that of the first opening, an insulating layer formed by covering sidewall surfaces of the first opening and the second opening, a conductive layer formed by covering at least an inner wall surface of the insulating layer and a bottom surface of the second opening, on an inner side of the insulating layer, a third opening formed to some point along the depth of the semiconductor substrate from the surface opposite to the active surface of the semiconductor substrate, and a heat-conductive layer formed inside the third opening.

In the semiconductor device of the present invention, the first electronic circuit, the second electronic circuit, the pad electrode, the first opening, the second opening, the insulating layer, and the conductive layer are formed on the semiconductor substrate. Furthermore, the third opening is formed to some point along the depth of the semiconductor substrate from the surface opposite to the active surface of the semiconductor substrate, and the heat-conductive layer is formed inside the third opening.

In still another embodiment of the present invention, there is provided a manufacturing method of a semiconductor device which includes a step of forming a first electronic circuit and a second electronic circuit on an active surface of a semiconductor substrate, the second electronic circuit having a during-operation heating density different from that of the first electronic circuit, and a step of forming a pad electrode on the active surface by being connected to the first electronic circuit and/or the second electronic circuit, a step of forming a first opening to some point along a depth of the semiconductor substrate toward the pad electrode from a surface opposite to the active surface of the semiconductor substrate, a step of forming a second opening having a diameter smaller than that of the first opening so as to reach the pad electrode from a bottom surface of the first opening, a step of forming an insulating layer by covering sidewall surfaces of the first opening and the second opening, a step of forming a conductive layer by covering at least an inner wall surface of the insulating layer and a bottom surface of the second opening at the inner side of the insulating layer, a step of forming a third opening to some point along the depth of the semiconductor substrate from the surface opposite to the active surface of the semiconductor substrate, and a step of forming a heat insulator by imbedding the third opening.

In the manufacturing method for a semiconductor device of the present invention, the first electronic circuit and the second electronic circuit having a during-operation heating density different from that of the first electronic circuit are formed on the active surface of the semiconductor substrate, and the pad electrode is formed on the active surface by being connected to the first electronic circuit and/or the second electronic circuit.

Then, the first opening is formed to some point along the depth of the semiconductor substrate toward the pad electrode from the surface opposite to the active surface of the semiconductor substrate, and the second opening having a diameter smaller than that of the first opening is formed so as to reach the pad electrode from the bottom surface of the first opening.

Then, the insulating layer is formed by covering the sidewall surfaces of the first opening and the second opening, and the conductive layer is formed by covering at least the inner wall surface of the insulating layer and the bottom surface of the second opening, on the inner side of the insulating layer.

Meanwhile, the third opening is formed to some point along the depth of the semiconductor substrate from the surface opposite to the active surface of the semiconductor substrate, and the heat insulator is formed by imbedding the third opening.

In still an embodiment of the present invention, there is provided a manufacturing method of a semiconductor device which includes a step of forming a first electronic circuit and a second electronic circuit on an active surface of a semiconductor substrate, the second electronic circuit having a during-operation heating density different from that of the first electronic circuit, and a step of forming a pad electrode on the active surface by being connected to the first electronic circuit and/or the second electronic circuit, a step of forming a first opening to some point along a depth of the semiconductor substrate toward the pad electrode from a surface opposite to the active surface of the semiconductor substrate, a step of forming a second opening having a diameter smaller than that of the first opening so as to reach the pad electrode from a bottom surface of the first opening, a step of forming an insulating layer by covering sidewall surfaces of the first opening and the second opening, a step of forming a conductive layer by covering at least an inner wall surface of the insulating layer and a bottom surface of the second opening, on an inner side of the insulating layer, a step of forming a third opening to some point along the depth of the semiconductor substrate from the surface opposite to the active surface of the semiconductor substrate, and a step of forming a heat-conductive layer inside the third opening.

In the manufacturing method of a semiconductor device of the present invention, the first electronic circuit, the second electronic circuit, and the pad electrode are formed on the active surface of the semiconductor substrate. The first opening is formed to some point along the depth of the semiconductor substrate, and the second opening is formed so as to reach the pad electrode from the bottom surface of the first opening. The insulating layer is formed by covering the sidewall surfaces of the first opening and the second opening, and the conductive layer is formed on the inner side of the insulating layer.

On the other hand, the third opening is formed to some point along the depth of the semiconductor substrate from the surface opposite to the active surface of the semiconductor substrate, and the heat-conductive layer is formed inside the third opening.

In the semiconductor devices according to an embodiment of the present invention, the third opening is formed to some point along the depth of the semiconductor substrate from the surface opposite to the active surface of the semiconductor substrate, and the heat insulator is formed by imbedding inside of the third opening, so that heat conduction from the second electronic circuit to the first electronic circuit is suppressed, or the heat-conductive layer is formed inside the third opening, so that heat from the second electronic circuit is radiated to an opposite side of the semiconductor substrate, thereby allowing the heat gradient at the pixel section of the solid-state imaging element to be reduced.

In the manufacturing methods of a semiconductor device according to the embodiments of the present invention, the third opening is formed to some point along the depth of the semiconductor substrate from the surface opposite to the active surface of the semiconductor substrate, and the heat insulator is formed by imbedding the third opening, so that heat conduction from the second electronic circuit to the first electronic circuit is suppressed, or the heat-conductive layer is formed inside the third opening, so that heat from the second electronic circuit is radiated to an opposite side of the semiconductor substrate, thereby allowing the heat gradient at the pixel section of the solid-state imaging element to be reduced.

DETAILED DESCRIPTION OF THE EMBODIMENTS

Embodiments of a semiconductor device and a manufacturing method thereof according to the present invention will now be described with reference to the drawings.

First Embodiment

Figure 1A:
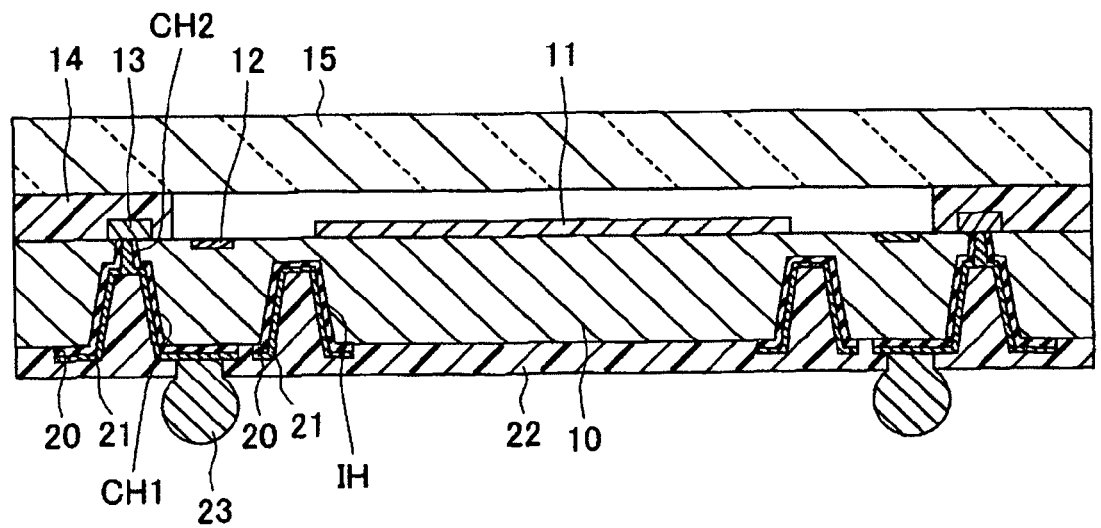
FIG. 1A is a schematic sectional view of a semiconductor device according to a first embodiment of the present invention.
Figure 1B:
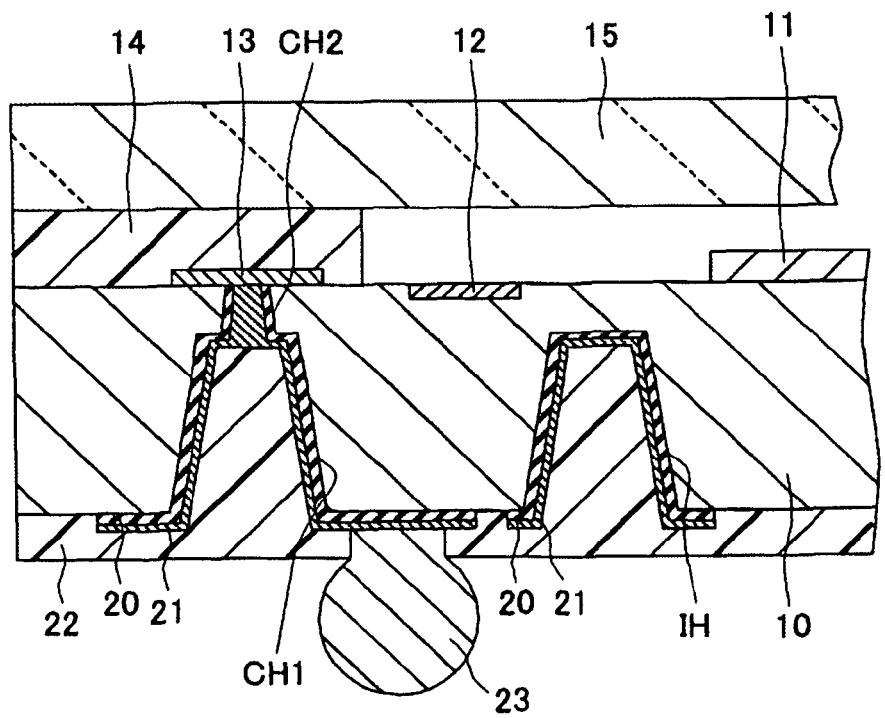
FIG. 1B is an enlarged view of a main portion of FIG. 1A.

FIG. 1A is a schematic sectional view of a semiconductor device according to a first embodiment, and FIG. 1B is an enlarged view of a main portion of FIG. 1A.

The semiconductor device according to the present embodiment is a semiconductor chip having a solid-state imaging element such as a CMOS image sensor, in which the solid-state imaging element is packaged by hermetic sealing.

For example, a photoelectric conversion circuit 11 as a first electronic circuit is formed on an active surface of a semiconductor substrate 10 made from silicon or the like, and a peripheral circuit 12 is formed as a second electronic circuit.

Here, the second electronic circuit (peripheral circuit) 12 is an electronic circuit having a during-operation heating density different from that of the first electronic circuit, and is, e.g., an input/output circuit, a comparator, a counter, a digital-to-analog (DA) converter, a phase-locked loop (PLL) circuit, and the like.

Furthermore, e.g., a pad electrode 13 is formed at a peripheral portion of the photoelectric conversion circuit 11, on the active surface of the semiconductor substrate 10, by being connected to the photoelectric conversion circuit 11 and/or the peripheral circuit 12.

Furthermore, e.g., a package substrate 15 made from a transparent substrate such as glass is disposed such that it faces the active surface of the semiconductor substrate 10, and in addition, a sealing resin layer 14 is formed in a clearance between the peripheral portion of the photoelectric conversion circuit 11 on the semiconductor substrate 10, and the package substrate 15, so as to hermetically seal the photoelectric conversion circuit 11. The photoelectric conversion circuit 11 is thus hermetically sealed.

In the present embodiment, the peripheral circuit 12 is also sealed by the sealing resin layer 14.

Furthermore, e.g., a first contact hole CH1 is formed as a first opening to some point along the depth of the semiconductor substrate 10 toward the pad electrode 13, from a surface opposite to the active surface of the semiconductor substrate 10. A second contact hole CH2 is formed as a second opening having a diameter smaller than that of the first contact hole CH1 so as to reach the pad electrode 13 from a bottom surface of the first contact hole CH1.

Furthermore, e.g., a heat-insulating opening IH is formed as a third opening toward a region between the photoelectric conversion circuit 11 and the peripheral circuit 12, from the surface opposite to the active surface of the semiconductor substrate 10.

Furthermore, e.g., an insulating layer 20 made from silicon oxide or the like is formed by covering sidewall surfaces of the first and the second contact holes CH1, CH2, and also, a conductive layer 21 made from copper or the like is formed by covering at least an inner wall surface of the insulating layer 20 and a bottom surface of the second contact hole Ch2, on an inner side of the insulating layer 20.

The insulating layer 20 is a layer for avoiding a short circuit between the semiconductor substrate 10 and the conductive layer 21. The insulating layer 20 and the conductive layer 21 are extended as far as to the outside of the opening on the surface opposite to the active surface of the semiconductor substrate 10, serving as a lead electrode.

The insulating layer 20 and the conductive layer 21 are formed also on an inner wall surface of the heat-insulating opening IH.

A protective film 22 made from a solder resist or the like is formed by covering the surface opposite to the active surface of the semiconductor substrate 10.

Here, the protective film 22 is formed by imbedding the first contact hole CH1 and the heat-insulating opening IH, on an inner side of the conductive layer 21, and functions as a heat insulator in the heat-insulating opening IH.

Furthermore, the protective film 22 also has an opening formed therein for exposing a part of the conductive layer 21, through which an external connection terminal 23 such as a solder ball bump or a gold stud bump is formed.

The semiconductor device according to the present embodiment is formed as described above.

The semiconductor device according to the present embodiment is used by mounting it to a mounting board, e.g., via the external connection terminal 23, or is used by mounting it on another board having a memory element formed thereon, in the form of a module.

Figure 2:
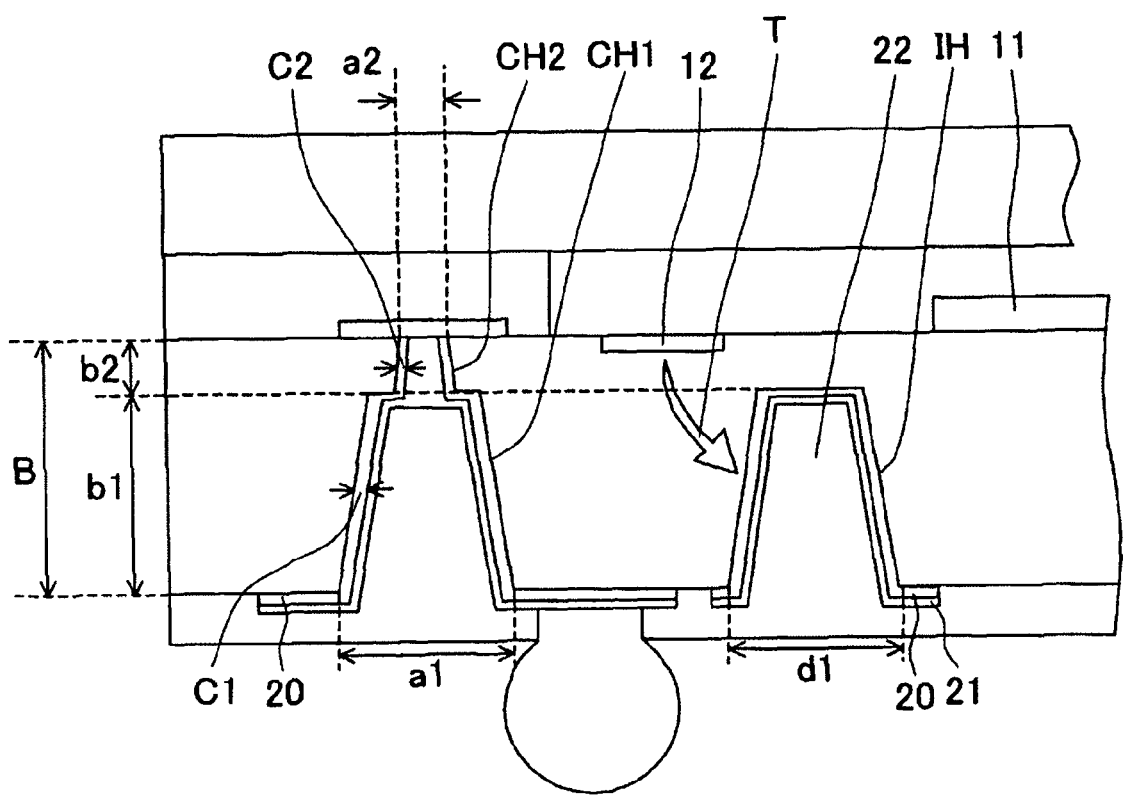
FIG. 2 is a schematic diagram for illustrating sizes of various parts and states of heat conduction during operation, of the semiconductor device according to the first embodiment of the present invention.

FIG. 2 is a schematic diagram for illustrating sizes of various parts and states of heat conduction during operation, of the semiconductor device according to the present embodiment.

In the semiconductor device, a diameter a2 of the second contact hole CH2 is preferably not more than 0.7 times, and more preferably, not less than 0.5 times of a diameter of the first contact hole CH1.

By forming the semiconductor device in the size, a degree of freedom in aligning the second contact hole CH2 with respect to the pad electrode 13 may be increased in a manufacturing method.

Also, a depth b1 of the first contact hole CH1 is preferably not less than 0.5 times and not more than 0.9 times of a thickness B of the semiconductor substrate 10.

If the depth b1 of the first contact hole CH1 is less than 0.5 times of the thickness B of the semiconductor substrate 10, an aspect ratio of the second contact hole CH2 becomes too large, and whereby processing of opening the second contact hole CH2 and of filling at the conductive layer becomes difficult, and TAT (Turn Around Time) will be long. Furthermore, if the depth b1 exceeds 0.9 times of the thickness B, a thickness of the semiconductor substrate 10 corresponding to a portion for forming the second contact hole CH2 becomes so thin that inconvenience may be caused during formation of the second contact hole CH2 and subsequent reliability tests.

For example, by setting the thickness B of the semiconductor substrate 10 to 200 μm, the diameter a1 and the depth b1 of the first contact hole CH1 to 80 μm and 160 μm, respectively, and the diameter a2 and a depth b2 of the second contact hole CH2 to 30 μm and 40 μm, respectively, a suitable shape if the through opening may be realized.

Also, in the insulating layer 20, a thickness c1 of a portion for covering a sidewall surface of the first contact hole CH1 is preferably made thicker than a thickness c2 of a portion for covering a sidewall surface of the second contact hole CH2.

By making the thickness c1 of the insulating layer at the first contact hole CH1 having a larger diameter thick, and by making the thickness of the insulating layer 20 at the second contact hole CH2 thin, a parasitic capacitance between the conductive layer 21 and the semiconductor substrate 10 is reduced, so that lower power consumption of the semiconductor device can be achieved, and also the second contact hole CH2 having a small diameter can be filled well at the conductor.

The insulating layer 20 is formed preferably from a single insulating material such as silicon oxide, but may be formed from a plurality of materials as well.

For example, when the whole insulating layer 20 is formed from silicon oxide, as explained in a later-described manufacturing method, a silicon oxide film is formed by covering the sidewall surface of the first contact hole CH1, and then a silicon oxide film at the bottom surface portion of the first contact hole CH1 is removed. Thereafter, the second contact hole CH2 is formed, and the silicon oxide film is formed by covering the sidewall surfaces of the first contact hole CH1 and the second contact hole CH2, thereby making the insulating layer of a portion of the first contact hole CH1 thick. Thus, the insulating layer having the configuration may be obtained.

In the configuration at issue in the related art in which the conductive layer is formed in the inner wall of the opening passing through the substrate, in order to prevent cracks and peelings, it is effective to make the diameter of the conductive layer smaller. For example, it may be considered to simply make the diameter of the through opening smaller. In this case, the processability of the through opening is impaired, thereby making it very difficult to form the opening reaching the pad electrode. In addition, if the diameter of the through opening is made smaller, the imbedding quality of the conductor during formation of the conductive layer is deteriorated, thereby making it very difficult to form the conductive layer.

Furthermore, it may also be considered to make the diameter of the conductive layer small, while leaving the diameter of the through opening similar to that of the related art and making the thickness of the silicon oxide film formed on the wall surface thick. Even in this case, the diameter of a space for forming the conductive layer is made so small that the filling quality of the conductor is deteriorated, thereby making it very difficult to form the conductive layer.

In the semiconductor device according to the present embodiment, the through opening is formed as the first contact hole CH1 and the second contact hole CH2 having a diameter smaller than that of the first contact hole CH1. With this configuration, cracks and peelings occurring due to differences in thermal expansion coefficients between the conductive layer imbedded in the through opening and the substrate or the pad electrode may be suppressed.

Furthermore, it is only the second contact hole CH2 that has a smaller diameter, therefore the through opening may be formed easily, as well as without causing deterioration of the imbedding quality of the conductor inside the through opening.

Furthermore, a diameter d1 of the heat-insulating opening IH is preferably approximately equal to the diameter a1 of the first contact hole CH1, and a depth of the heat-insulating opening IH is also approximately equal to the depth b1 of the first contact hole CH1.

Accordingly, by making the diameter and the depth of the heat-insulating opening IH approximately equal to those of the first contact hole, both can be formed simultaneously.

States of heat conduction during operation of the semiconductor device will be described here.

As shown in FIG. 2, the heat-insulating opening (third opening) IH is formed to some point along the depth of the semiconductor substrate from the surface opposite to the active surface of the semiconductor substrate, and the protective film 22 becoming the heat insulator by being imbedded in the heat-insulating opening IH is formed. The heat-insulating opening IH functions to block heat conduction. Accordingly, when a heating density of the peripheral circuit (second electronic circuit) 12 is larger than that of the photoelectric conversion circuit (first electronic circuit) 11, conduction of heat T generated at the peripheral circuit (second electronic circuit) 12 to the photoelectric conversion circuit (first electronic circuit) 11 is suppressed, whereby the heat gradient at the pixel section of the solid-state imaging element may be reduced.

Materials used to fill the heat-insulating opening IH may include synthetic resin compositions having a lower heat conductivity than silicon, such as, e.g., epoxy, polyolefin, fluorine, liquid crystal, and acrylic resin compositions, or mixtures of a synthetic resin composition and an inorganic material.

Referring next to FIGS. 3A, 3B to 8A, 8B, a manufacturing method of the semiconductor device according to the present embodiment will be described.

Figure 3A:
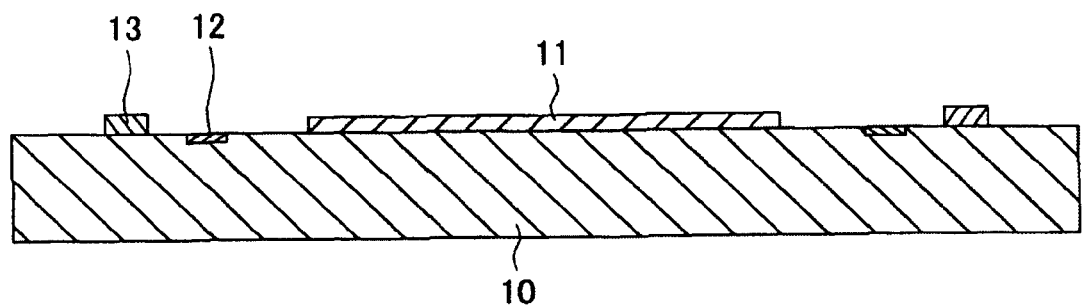
FIGS. 3A and 3B are sectional views showing manufacturing steps of a manufacturing method of the semiconductor device according to the first embodiment of the present invention.

First, as shown in FIG. 3A, e.g., the photoelectric conversion circuit 11 as the first electronic circuit and the peripheral circuit 12 as the second electronic circuit are formed on the active surface of the semiconductor substrate 10 made from silicon or the like. The second electronic circuit (peripheral circuit) 12 is an electronic circuit having a during-operation heating density differing from that of the first electronic circuit, and is, e.g., an input/output circuit, a comparator, a counter, a digital-to-analog (DA) converter, a phase-locked loop (PLL) circuit, and the like.

Also, the pad electrode 13 is formed at a peripheral portion of the photoelectric conversion circuit 11 on the active surface of the semiconductor substrate 10, by being connected to the photoelectric conversion circuit 11 and/or the peripheral circuit 12.

Figure 3B:
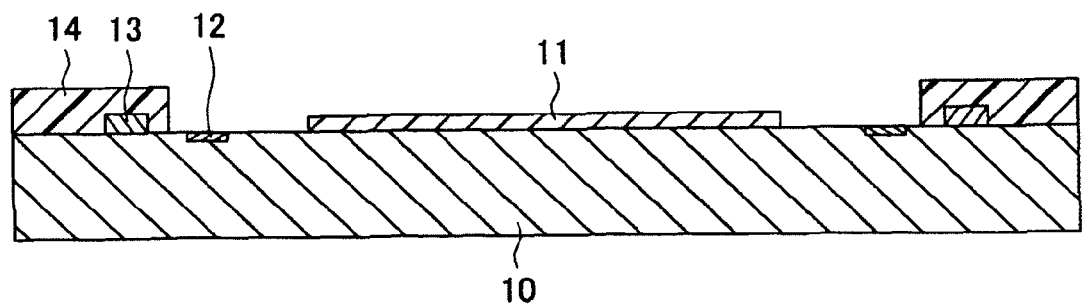

Then, as shown in FIG. 3B, e.g., by coating a resin layer using a spin coat method or the like, the sealing resin layer 14 is formed at the peripheral portion of the photoelectric conversion circuit 11 on the semiconductor substrate 10, so as to cover the pad electrode 13 at the peripheral portion of the photoelectric conversion circuit 11 on the semiconductor substrate 10.

For a region covered by the sealing resin layer 14, an appropriate value need be selected since the region is relevant to a degree of intimate contact with the package substrate for bonding at a next step. Preferably, the region is wider than a width of the pad electrode 13 and extends up to an inward position distant from a prohibition region of the sealing resin layer 14 10 μm or more. If the sealing resin layer 14 is formed nearest to its prohibition region, inconvenience may likely to occur if the sealing resin is squeezed out in the next step of its bonding to the package substrate.

Figure 4A:
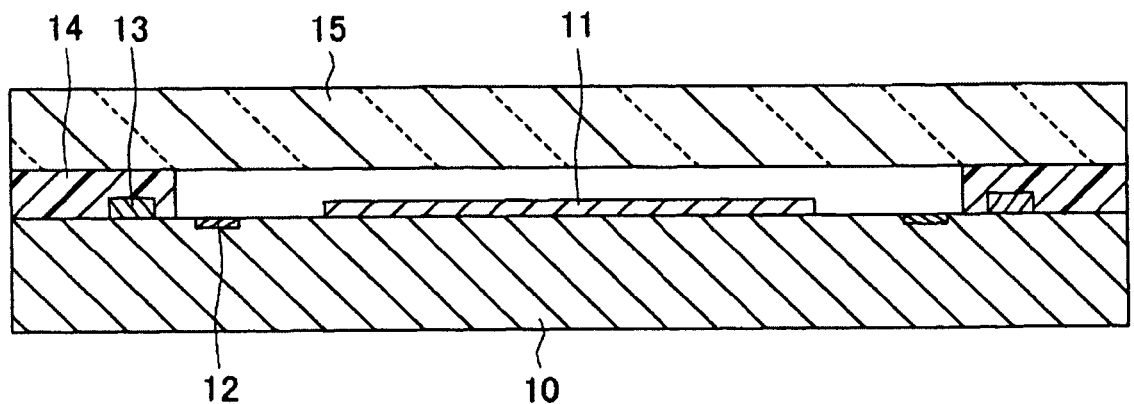
FIGS. 4A and 4B are sectional views showing a manufacturing step of the manufacturing method of the semiconductor device according to the first embodiment of the present invention.

Then, as shown in FIG. 4A, e.g., the package substrate 15 made from a transparent substrate such as glass is disposed on the sealing resin layer 14 such that it faces to the active surface of the semiconductor substrate 10, thereby hermetically sealing the photoelectric conversion circuit 11 and the peripheral circuit 12 by the package substrate 15 and the sealing resin layer 14.

While in the sealing resin layer 14, a portion for covering the pad electrode 13 and a portion for hermetic sealing the package substrate 15 formed from a transparent substrate such as glass, is made from a single sealing resin layer, the sealing resin layer may otherwise be formed from a plurality of sealing resin materials.

Figure 4B:
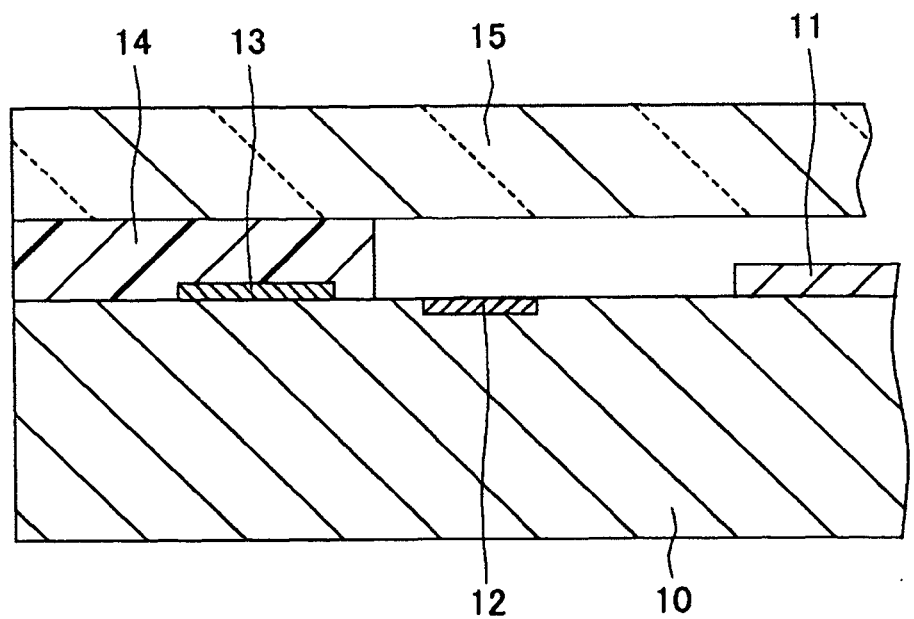

FIG. 4B is an enlarged view of a main portion of FIG. 4A. Subsequent steps will be described with reference to enlarged views.

Figure 5A:
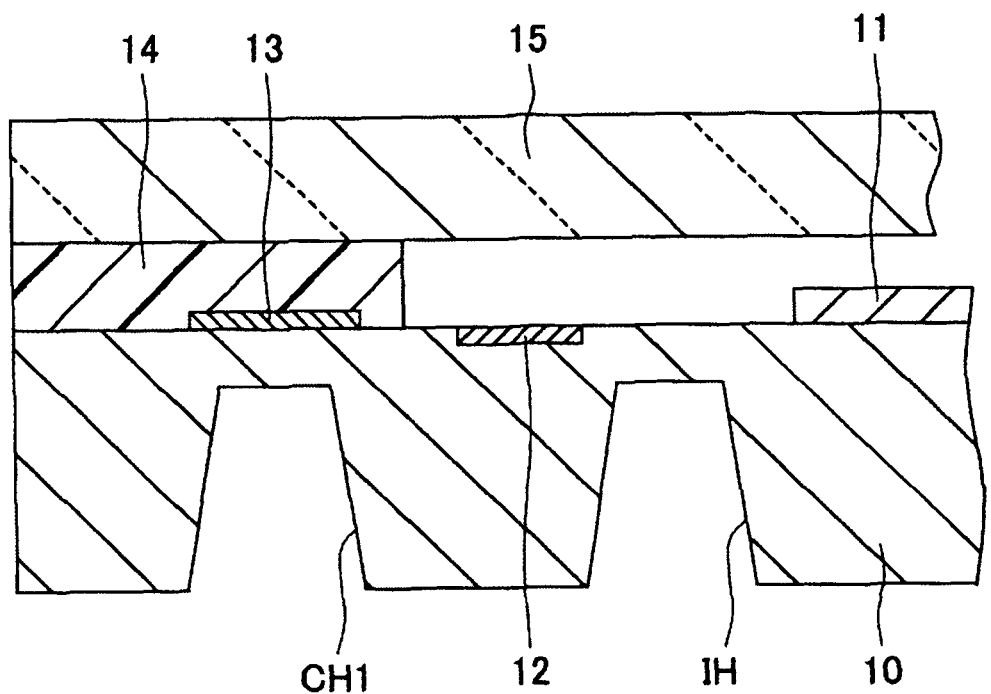
FIGS. 5A and 5B are sectional views showing manufacturing steps of the manufacturing method of the semiconductor device according to the first embodiment of the present invention.

Then, as shown in FIG. 5A, e.g., a resist film, not shown, having a pattern for opening the first contact hole by a photolithography process is formed on the surface opposite to the active surface of the semiconductor substrate 10, and the resist film is subject to an anisotropic dry etching process such as RIE (Reactive Ion Etching) to form the first contact hole (first opening) CH1 to some point along the depth of the semiconductor substrate 10 toward the pad electrode 13.

Here, the depth of the first contact hole CH1 is preferably set to be a value not less than 0.5 times and not more than 0.9 times of the thickness of the semiconductor substrate 10.

In the step of forming the first contact hole CH1, simultaneously the heat-insulating opening (third opening) IH to some point along the depth of the semiconductor substrate 10 is also formed, toward a region between the photoelectric conversion circuit 11 and the peripheral circuit 12 from the surface opposite to the active surface of the semiconductor substrate 10.

The geometry of the heat-insulating opening IH such as diameter and depth is made substantially equal to that of the first contact hole CH1.

Figure 5B:
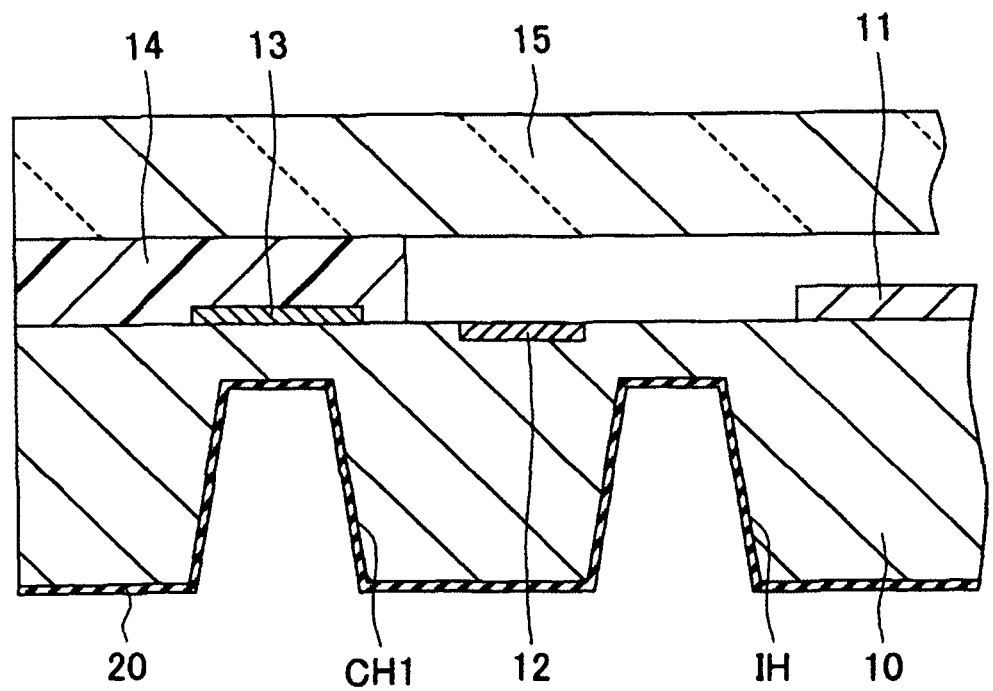

Then, as shown in FIG. 5B, e.g., silicon oxide is deposited at a thickness ranging from several hundreds of nanometers to several micrometers by covering the sidewall surfaces and bottom surfaces of the first contact hole CH1 and the heat-insulating opening IH by a CVD (Chemical Vapor Deposition) method, thereby forming the insulating layer 20.

Figure 6A:
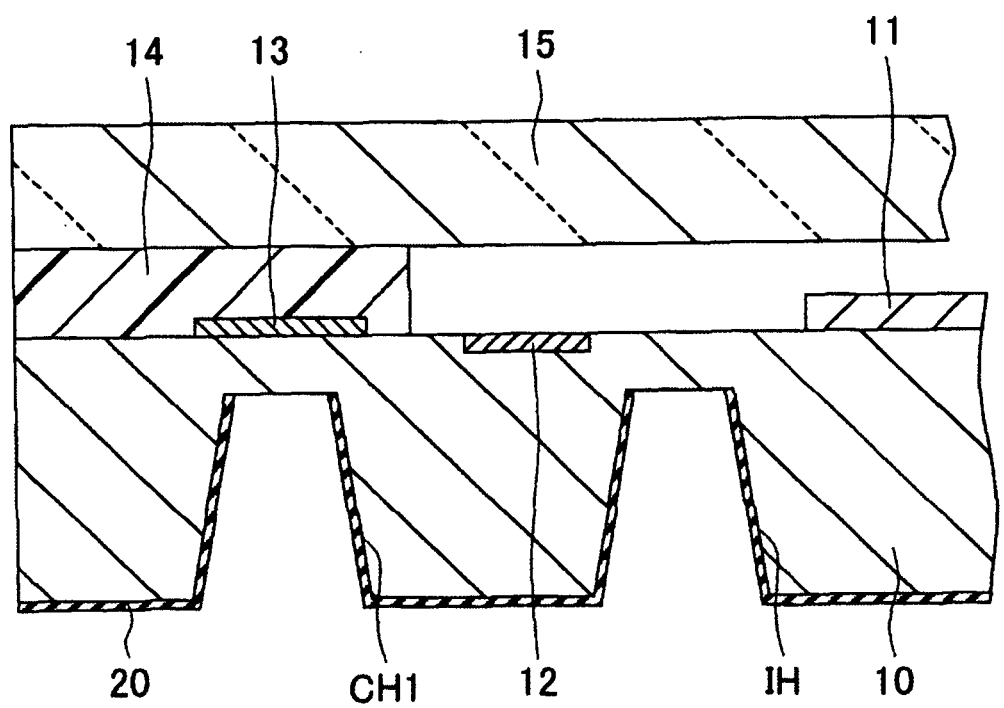
FIGS. 6A and 6B are sectional views showing manufacturing steps of the manufacturing method of the semiconductor device according to the first embodiment of the present invention.

Then, as shown in FIG. 6A, e.g., the insulating layer at the bottom surfaces of the first contact hole CH1 and the heat-insulating opening IH is removed by the anisotropic dry etching process such as RIE.

Figure 6B:
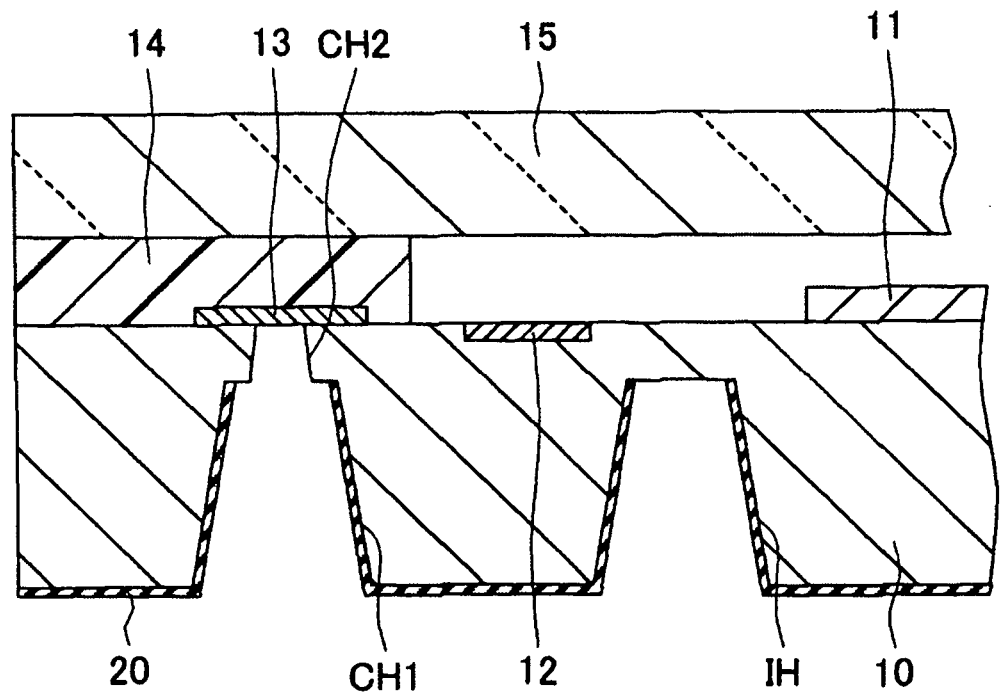

Then, as shown in FIG. 6B, e.g., the second contact hole CH2 having a diameter smaller than that of the first contact hole CH1 is formed so that it reaches the pad electrode 13 from the bottom surface of the first contact hole CH1, by irradiating a laser beam such as a four dimension harmonic wave (266 nm) of a YAG laser or an ArF excimer laser.

For example, by using the four dimension harmonic wave (266 nm) of the YAG laser, an opening whose diameter is not more than 10 μm may be formed.

Here, the diameter of the second contact hole CH2 is set to be preferably not more than 0.7 times, or more preferably not more than 0.5 times of the diameter of the first contact hole CH1.

Furthermore, on the basis of the preferable range of the depth of the first contact hole CH1, a preferable range of the depth of the second contact hole is larger than 0.1 times and less than 0.5 times of the thickness of the semiconductor substrate 10. Particularly, in view of 3-5% variations in the in-plane processing of a wafer during the step of opening the first contact hole CH1, a margin of around 10 μm is necessary for a 200 μm-thick semiconductor substrate, and hence the depth of the second contact hole CH2 is preferably be not less than 10 μm.

In the heat-insulating opening IH, contact hole is not formed by a laser beam.

Figure 7A:
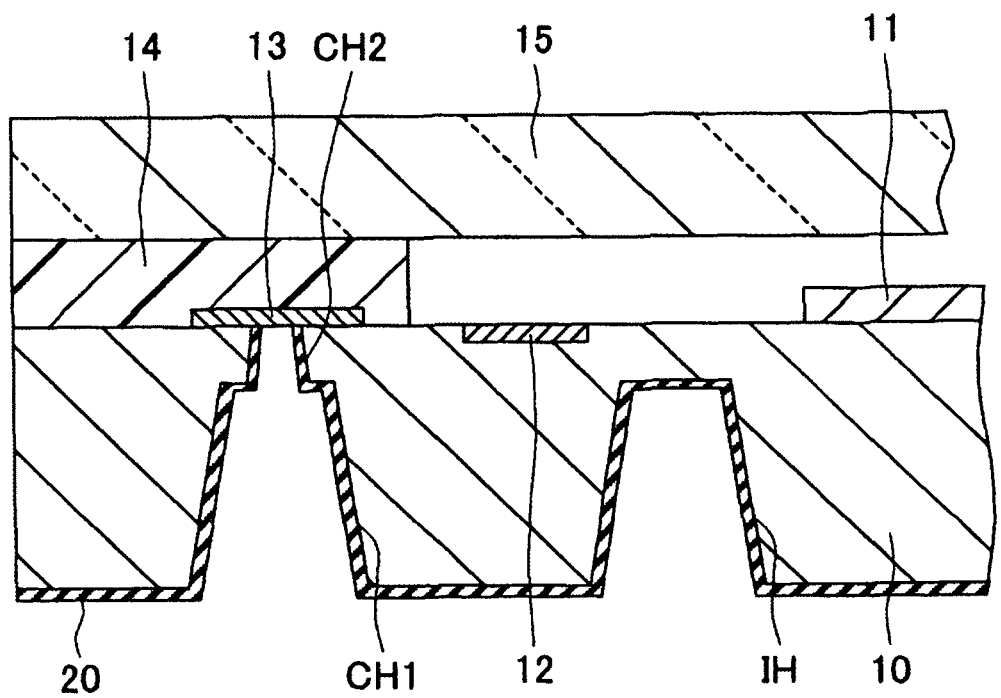
FIGS. 7A and 7B are sectional views showing manufacturing steps of the manufacturing method of the semiconductor device according to the first embodiment of the present invention.

Then, as shown in FIG. 7A, e.g., the insulating layer 20 is formed by forming a silicon oxide film on the wall surface of the second contact hole CH2 and the wall surface of the heat-insulating opening IH by the CVD method, and the insulating layer 20 is made thicker at the wall surfaces portion of the first contact hole CH1 and the heat-insulating opening IH.

By the steps, the insulating layer 20 can be formed such that its portion covering the sidewall surface of the first contact hole CH1 is made thicker than a portion covering the sidewall surface of the second contact hole CH2. Thereafter, similarly to when the insulating layer is removed from the bottom surfaces of the first contact hole CH1 and the heat-insulating opening IH, the insulating film is removed from the bottom surface of the second contact hole CH2 by using the anisotropic dry etching process such as RIE or the like, thereby exposing the pad electrode 13 formed on the active surface.

Figure 7B:
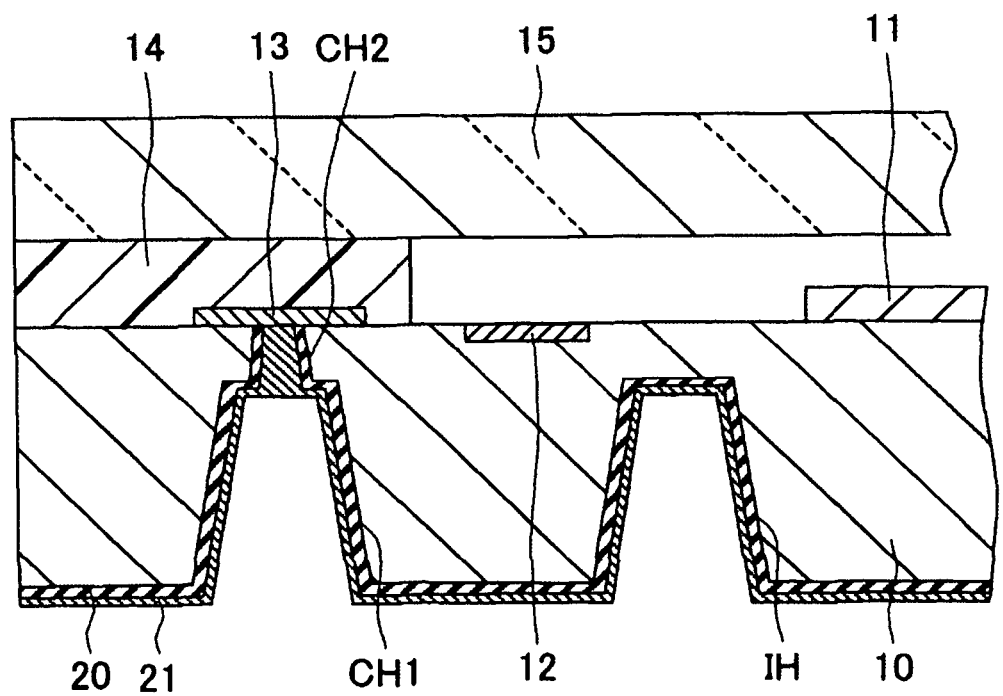

Then, as shown in FIG. 7B, e.g., by forming a copper seed layer by sputtering, and by electroplating processing of copper or the like, at least the inner wall surface of the insulating layer 20 and the bottom surface of the second contact hole CH2 are covered, on an inner side of the insulating layer 20, thereby forming the conductive layer 21 made from copper.

At this time, the conductive layer 21 made from copper is formed on the inner side of the insulating layer 20, similar with the case of the heat-insulating opening IH.

Figure 8A:
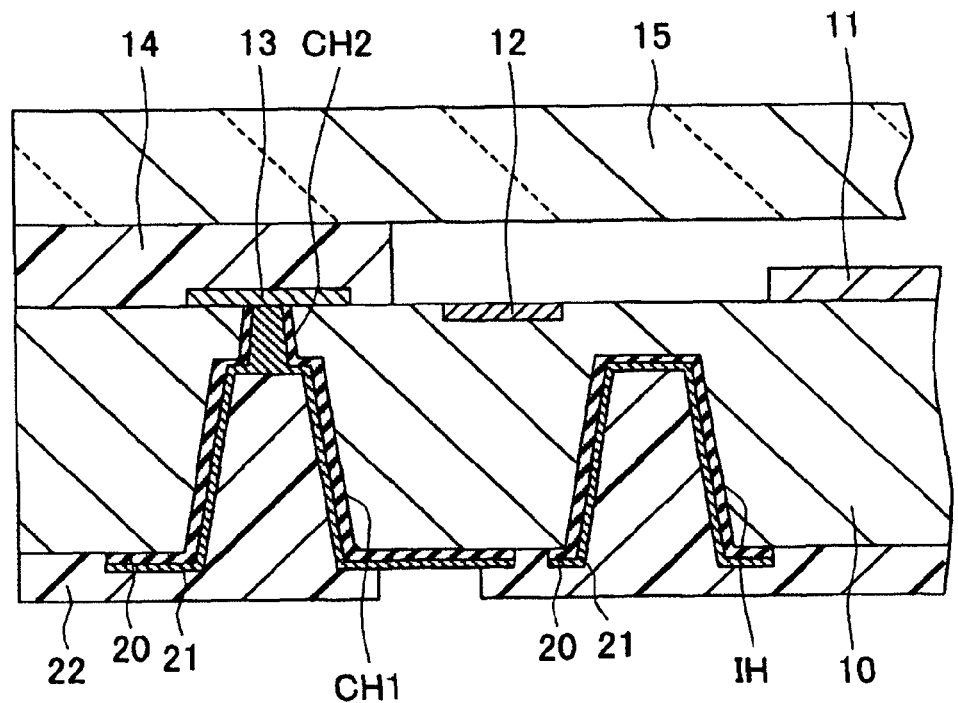
FIGS. 8A and 8B are sectional views showing manufacturing steps of the manufacturing method of the semiconductor device according to the first embodiment of the present invention.

Then, as shown in FIG. 8A, e.g., a resist film, not shown, having a predetermined pattern is formed by the photolithography process, to pattern the conductive layer 21 by using a known etching method or the like, thereby forming a lead electrode extended to the outside of the opening on the surface opposite to the active surface of the semiconductor substrate 10.

At this time, the conductive layer 21 is similarly patterned, also in the heat-insulating opening IH.

Then, the protective film 22 such as a solder resist is formed for covering the surface opposite to the active surface of the semiconductor substrate 10 and for imbedding the first contact hole CH1, the second contact hole CH2, and the heat-insulating opening IH. An opening is formed in the protective film 22 in order to expose the conductive layer 21 at an external connection terminal forming region.

Here, the protective film 22 functions as a heat insulator in the heat-insulating opening IH.

In the protective film, the same insulating material is used to form portions for filling the first contact hole CH1, the second contact hole CH2, and the heat-insulating opening IH, and a portion for covering the surface opposite to the active surface of the semiconductor substrate 10. However, different insulating materials may otherwise be used to form these portions, respectively.

In this case, a heat-insulating material is used at least to imbed the heat-insulating opening IH.

Figure 8B:
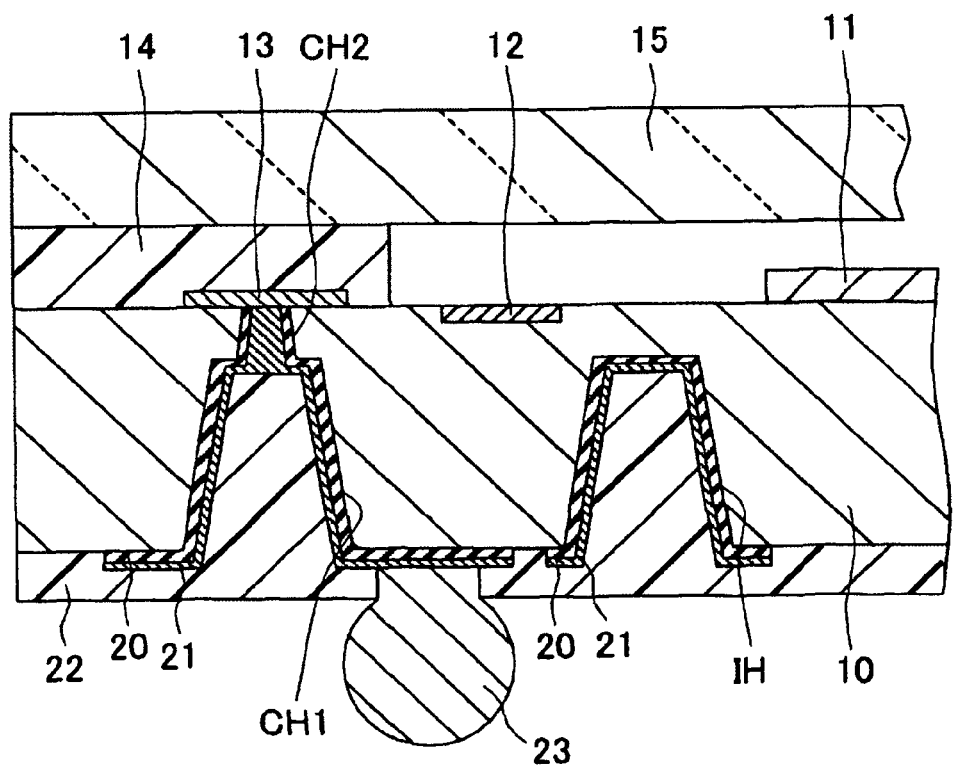

Then, as shown in FIG. 8B, e.g., the external connection terminal 23 such as a solder ball or gold stud bump is formed at the opening of the protective film 22.

In the above way, the semiconductor device according to the present embodiment may be formed.

As a subsequent step, dicing is performed to dice a wafer into small chips, e.g., when the processing is performed on a wafer.

According to the manufacturing method of the semiconductor device of the present embodiment, the heat-insulating opening (third opening) IH is formed to some point along the depth of the semiconductor substrate from the surface opposite to the active surface of the semiconductor substrate, and the protective film 22 serving as a heat insulator is formed by being imbedded in the heat-insulating opening IH, thereby suppressing conduction of heat to the photoelectric conversion circuit (first electronic circuit) 11, e.g., from the peripheral circuit (second electronic circuit) 12, and hence allowing the heat gradient at the pixel section of the solid-state imaging element to be reduced.

Furthermore, by forming the first contact hole and the second contact hole having a diameter smaller than that of the first contact hole as the through opening, cracks and peelings caused by differences in thermal expansion coefficients between the conductive layer to be imbedded in the through opening and the substrate or the pad electrode may be suppressed.

In recent years, there is a demand for lower power consumption and high-speed processing of semiconductor devices, and there is also a demand for lower parasitic capacitances in their through-holes. The parasitic capacitances in the through-holes can be reduced by making an insulating layer formed between a conductive material layer formed on a sidewall of a through opening and a silicon substrate thick. The insulating material (e.g., silicon oxide) for keeping insulation from silicon is typically formed by the CVD method or the like to keep uniformity in coverage. However, if the insulating layer is made thick to achieve lower capacitances, there has been an issue that more time is required, and thus that TAT becomes long. Furthermore, in the related-art through opening geometry that is tapered, there has been another issue that a thicker insulating layer deteriorates the imbedding quality of the conductive layer near the bottom of the through opening.

In the semiconductor device of the present embodiment, the insulating film is formed twice, so that the insulating film may be formed thick easily. Furthermore, it is only the insulating layer for the first contact hole having a larger diameter that the thickness is increased, and the insulating layer for the second contact hole can be formed thin, thereby making it possible to prevent deterioration of the imbedding quality of the conductive layer.

Furthermore, if a probe mark left on the pad electrode during inspection is superposed on a through opening forming region, inconvenience such as pad corrosion may likely occur. However, in the present embodiment, the through opening for the second contact hole reaching the pad electrode can actually be formed small by laser irradiation, thereby allowing the through opening to be formed with high accuracy by bypassing the probe mark.

Furthermore, for miniaturization of the through opening, there have been issues of erroneous positioning or the like of the through opening, when balanced with alignment accuracy, and yield reduction in terms of the whole wafer is possible, because the through opening is formed from the back surface of the device to the bonding pad for contact. For this reason, it has been difficult to miniaturize bonding pads, which has been a disadvantage to device size reduction. However, in the present embodiment, by actually forming the second contact hole reaching the pad electrode, the through opening small by laser irradiation, even when the first contact hole CH1 is misaligned with the pad electrode 13, as long as they are overlapping to some extent, the second contact hole CH2 can be formed with high accuracy. As a result, the pad electrode can be size-reduced, thereby realizing downsizing of the device.

Second Embodiment

Figure 9:
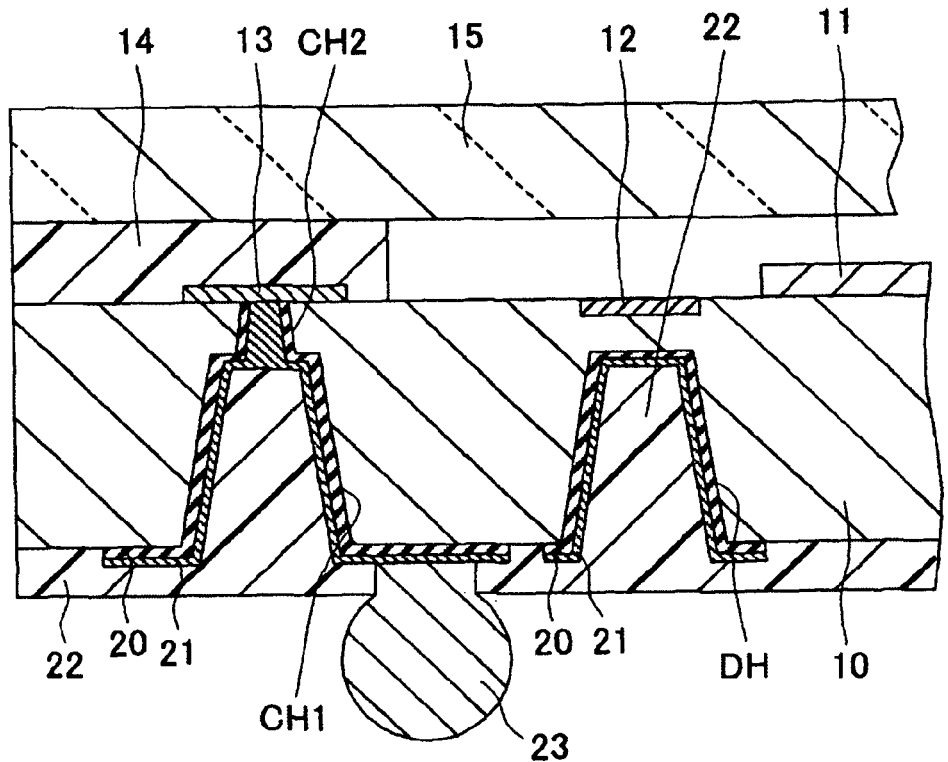
FIG. 9 is an enlarged schematic sectional view of a main portion of a semiconductor device according to a second embodiment of the present invention.

FIG. 9 is an enlarged schematic sectional view of a main portion of a semiconductor device according to a present embodiment.

In the semiconductor device according to the present embodiment, e.g., a heat-radiating opening DH as the third opening is formed in place of the heat-insulating opening in the first embodiment, toward a peripheral circuit 12 region from the surface opposite to the active surface of the semiconductor substrate 10. The insulating layer 20 and the conductive layer 21 are formed on an inner wall surface of the heat-radiating opening DH, and the protective film 22 is formed by imbedding an inner portion thereof.

The heat-radiating opening DH preferably has a diameter and a depth thereof approximately equal to those of the first contact hole CH1, so that the heat-radiating opening DH can be formed simultaneously with the first contact hole.

Other than the above, a configuration of the semiconductor device according to the second embodiment is similar to that of the semiconductor device according to the first embodiment.

Figure 10:
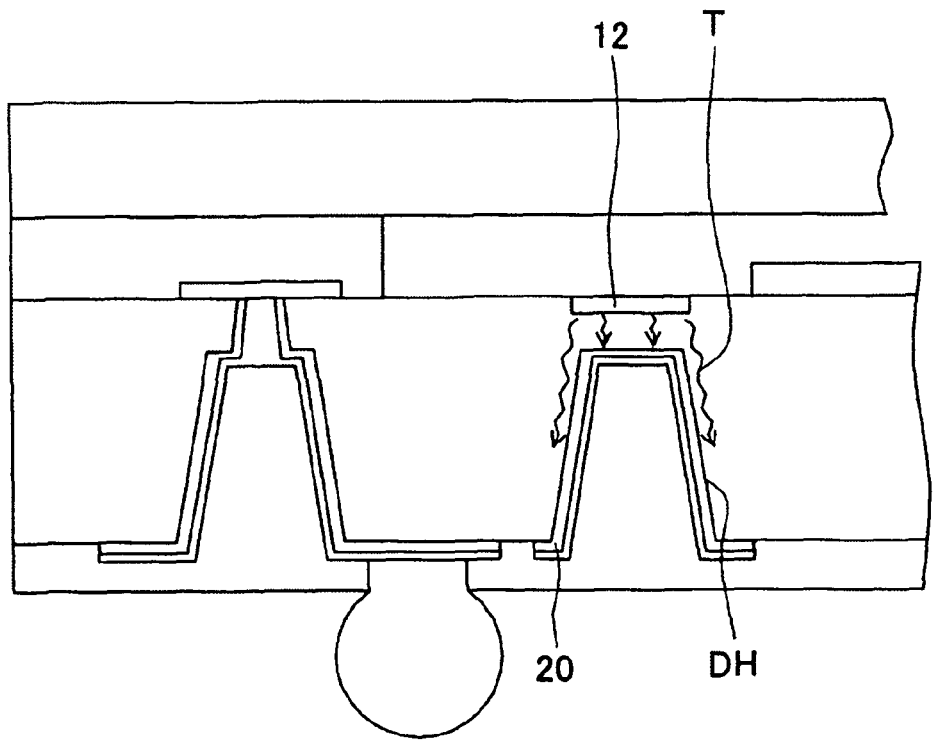
FIG. 10 is a schematic diagram for illustrating states of heat conduction during operation, of the semiconductor device according to the second embodiment of the present invention.

FIG. 10 is a schematic diagram for illustrating states of heat conduction during operation of the semiconductor device according to the present embodiment.

In the configuration, the conductive layer 21 formed on the inner wall surface of the heat-radiating opening DH is a layer functioning as a heat-conductive layer. Here, a heat-conductive material may include copper, nickel, and gold.

The heat-radiating opening (third opening) DH is formed to some point along the depth of the semiconductor substrate from the surface opposite to the active surface of the semiconductor substrate, and the conductive layer 21 serving as the heat-conductive layer is formed on the inner wall surface of the heat-radiating opening DH. A portion of the heat-radiating opening DH has a function of dissipating heat. Accordingly, heat T generated at the peripheral circuit (second electronic circuit) 12 is dissipated efficiently toward the back surface side of the semiconductor substrate 10, thereby suppressing heat conduction to the photoelectric conversion circuit (first electronic circuit) 11, and hence allowing the heat gradient at the pixel section in the solid-state imaging element to be reduced.

In the semiconductor device of the present embodiment, the conductive layer 21 in the heat-radiating opening (third opening) DH functioning as the heat-conductive layer is preferably extended as far as to the back surface side of the semiconductor substrate 10, and may also be connected to the external connection terminal and the like in view of enhancing heat dissipation characteristics.

Third Embodiment

Figure 11:
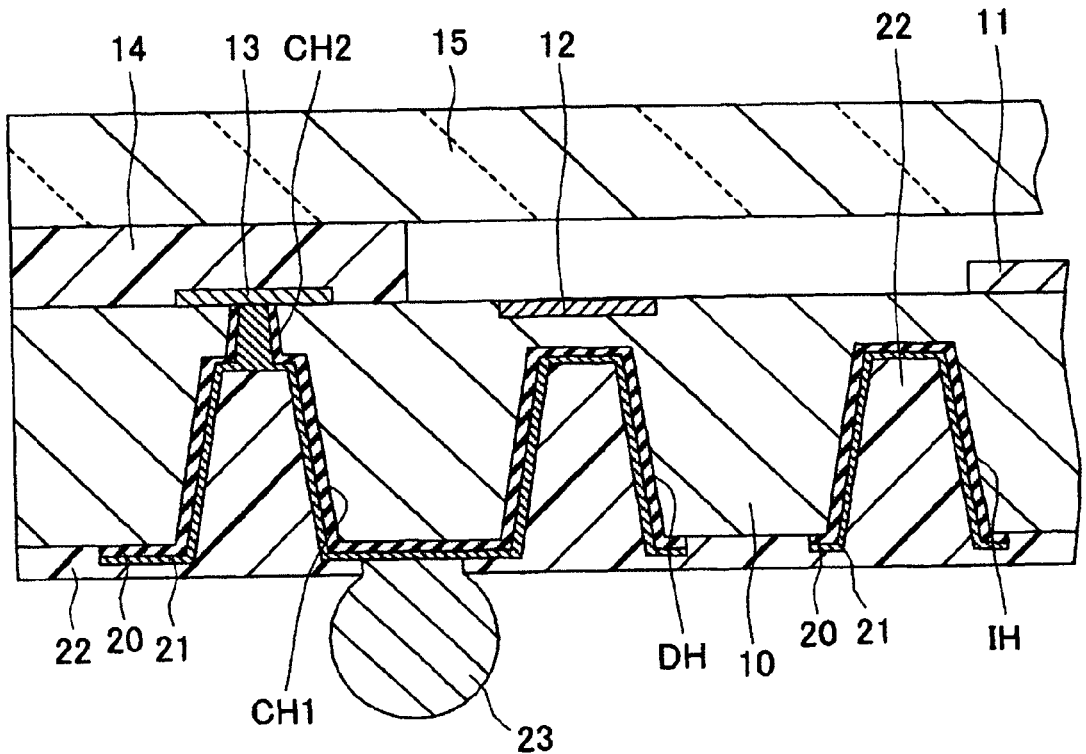
FIG. 11 is an enlarged schematic sectional view of a main portion of a semiconductor device according to a third embodiment of the present invention.

FIG. 11 is an enlarged schematic sectional view of a main portion of a semiconductor device according to a present embodiment.

In the semiconductor device according to the present embodiment, e.g., the heat-radiating opening DH as a fourth opening is formed toward the peripheral circuit 12 region from the surface opposite to the active surface of the semiconductor substrate 10, such as shown in the second embodiment, in addition to the heat-insulating opening in the first embodiment. The insulating layer 20 and the conductive layer 21 are formed on the inner wall surface of the heat-radiating opening DH, and the protective film 22 is formed by imbedding the inner side thereof.

The heat-insulating opening IH and the heat-radiating opening DH preferably have diameters and depths thereof approximately equal to those of the first contact hole CH1, respectively. As a result, the heat-insulating opening IH and the heat-radiating opening DH can be formed simultaneously with the first contact hole.

Other than the above, a configuration of the semiconductor device according to the present embodiment is similar to that of the semiconductor device according to the first embodiment.

Figure 12:
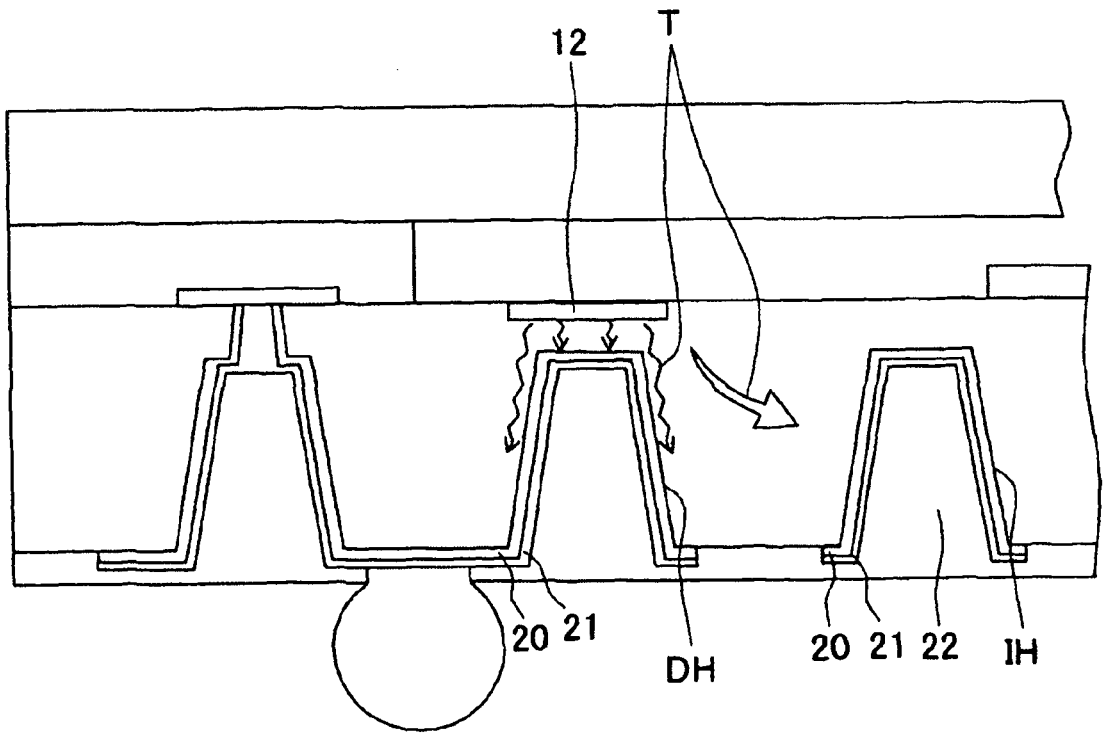
FIG. 12 is a schematic diagram for illustrating states of heat conduction during operation, of the semiconductor device according to the third embodiment of the present invention.

FIG. 12 is a schematic diagram for illustrating states of heat conduction during operation of the semiconductor device according to the present embodiment.

The heat-insulating opening (third opening) IH is formed to some point along the depth of the semiconductor substrate from the surface opposite to the active surface of the semiconductor substrate, and the protective film 22 serving as the heat insulator by being imbedded in the heat-insulating opening IH is formed, to provide a portion of the heat-insulating opening IH with a function of blocking heat conduction.

Furthermore, the heat-radiating opening (fourth opening) DH is formed to some point along the depth of the semiconductor substrate from the surface opposite to the active surface of the semiconductor substrate, and the conductive layer 21 serving as the heat-conductive layer is formed on the inner wall surface of the heat-radiating opening DH, to dissipate heat T generated at the peripheral circuit (second electronic circuit) 12 toward the back surface side of the semiconductor substrate 10.

Accordingly, conduction of the heat T generated at the peripheral circuit (second electronic circuit) 12 to the photoelectric conversion circuit (first electronic circuit) 11 is suppressed, so that the heat gradient at the pixel section in the solid-state imaging element may be further reduced.

In the semiconductor device of the present embodiment, the conductive layer 21 in the heat-radiating opening (fourth opening) DH functioning as the heat-conductive layer is preferably extended as far as to the back surface side of the semiconductor substrate 10, and may also be connected to the external connection terminal and the like in view of enhancing the heat dissipation characteristics. In the present embodiment, a state is shown in which the conductive layer in the heat-radiating opening is integrated with the conductive layer extended from the first contact hole CH1.

Fourth Embodiment

Figure 13:
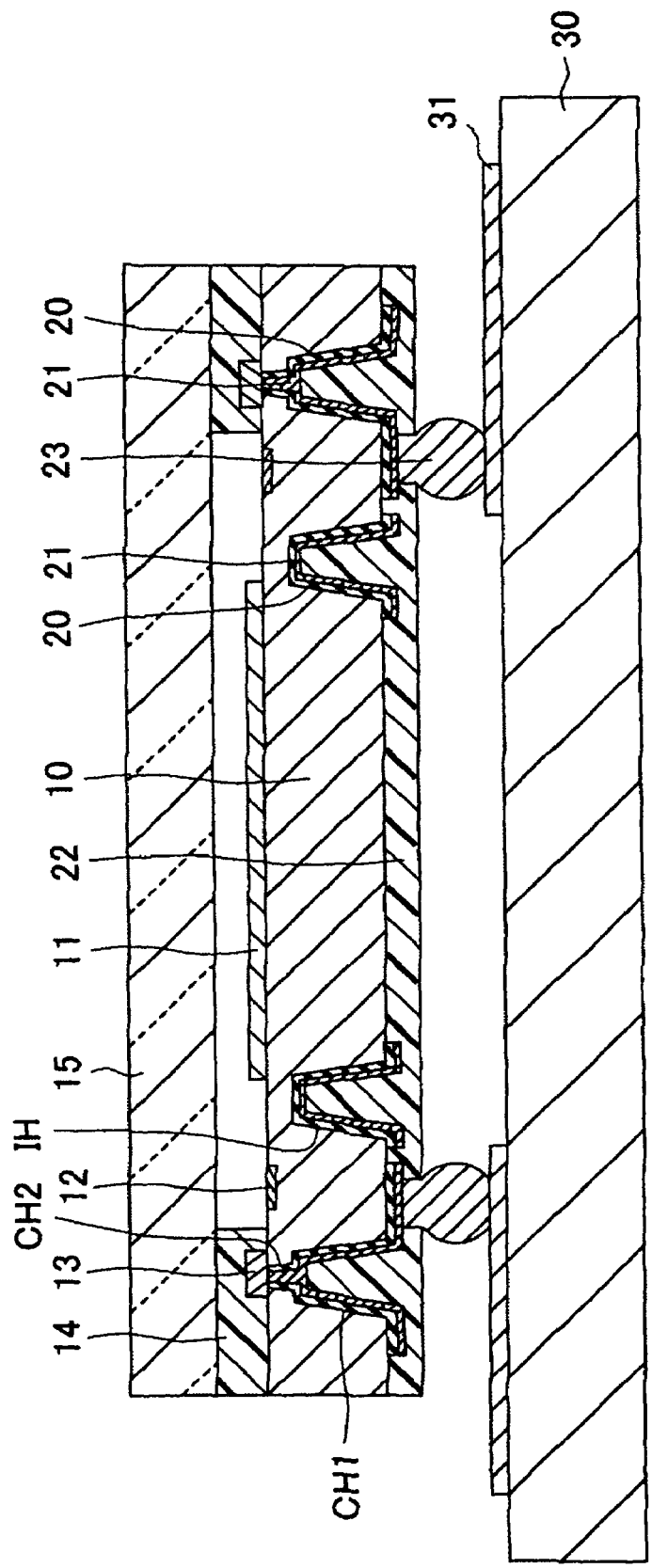
FIG. 13 is a schematic sectional view of a semiconductor device according to a fourth embodiment of the present invention.

FIG. 13 is a sectional view of a semiconductor device according to a fourth embodiment.

The semiconductor device according to the first to third embodiments is used, e.g., by mounting as a module via bumps 23 on wiring 31 of a memory substrate 30 having, e.g., a memory elements or the like formed thereon, or by mounting to wiring on another mounting board. In the drawing, the semiconductor device according to the first embodiment is shown.

In addition to this configuration, the semiconductor device according to the first embodiment may be used by mounting on various mounting boards and semiconductor substrates.

According to the semiconductor device according to each of the embodiments of the present invention, the following advantages may be obtained.

The heat-insulating opening IH is formed to some point along the depth of the semiconductor substrate from the surface opposite to the active surface of the semiconductor substrate, and the protective film 22 serving as the heat insulator is formed by being imbedded in the heat-insulating opening IH, thereby suppressing conduction of the heat T generated at the peripheral circuit (second electronic circuit) 12 to the photoelectric conversion circuit (first electronic circuit) 11. Alternatively, the heat-conductive layer is formed in the heat-radiating opening DH, and thus the heat from the peripheral circuit (second electronic circuit) is dissipated to a side opposite to the semiconductor substrate, so that the heat gradient in the photoelectric conversion circuit (first electronic circuit) may be reduced.

Furthermore, in the semiconductor device according to each of the embodiments of the present invention, by making the diameter of the opening (second contact hole) to be contacted with the pad electrode small, it becomes possible to reduce the influence of thermal expansion of the conductive layer formed in the opening, thereby allowing high reliability to be achieved.

Furthermore, excluding the portion of contact with the pad electrode, the first contact hole having a larger diameter, is formed, so that TAT for forming the through opening may be shortened. In addition, this configuration is applicable even to thick wafers, thereby allowing handling performance to be enhanced.

Furthermore, contact with the pad electrode is implemented through the second contact hole having a smaller diameter, thereby improving a degree of freedom in aligning the through opening and the pad electrode. In addition, the through opening can be formed by bypassing a probe mark during inspection of a semiconductor wafer, thereby allowing the yield of the through opening to be improved.

Furthermore, by forming the second contact hole whose diameter is smaller, a size reduction of the pad electrode can be achieved.

Furthermore, the insulating layer on the wall surface of the first contact hole is made thicker than that on the second contact hole, allowing the parasitic capacitance between the conductive layer in the opening and the semiconductor substrate to be reduced.

The present invention is not limited to the embodiments.

For example, the present invention is applicable not only to semiconductor devices packaged by hermetically sealing a solid-state imaging device such as a CMOS image sensor, but also to semiconductor devices having some other electronic element hermetically sealed therein.

Furthermore, the present invention is not limited to semiconductor devices having configurations in which some other electronic element is hermetically sealed, but includes semiconductor devices having wiring passing through the substrate.

In addition, the present invention can be modified in various ways without departing from the gist of the present invention.

The semiconductor device according to embodiments of the present invention is applicable to semiconductor devices having wiring passing through the substrate, such as packaged semiconductor devices in which a solid-state imaging device or the like is hermetically sealed.

The manufacturing method of a semiconductor device according to embodiments of the present invention is applicable to manufacturing methods of a semiconductor device having wiring passing through the substrate of a packaged semiconductor device in which a solid-state imaging device or the like is hermetically sealed.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-130354 filed in the Japanese Patent Office on May 16, 2007, the entire content of which being incorporated herein by reference.

What is claimed is:

1. A semiconductor device comprising:
    a semiconductor substrate having a first electronic circuit and a second electronic circuit formed on an active surface of the semiconductor substrate, the second electronic circuit having a heating density during operation different from that of the first electronic circuit;
    a pad electrode formed on the active surface by being connected to the first electronic circuit and/or the second electronic circuit;
    a first opening formed to some point along a depth of the semiconductor substrate foward the pad electrode from a surface opposite to the active surface of the semiconductor substrate;
    a second opening formed so as to reach the pad electrode from a bottom surface of the first opening, the second opening having a diameter smaller than that of the first opening;
    an insulating layer formed by covering sidewall surfaces of the first opening and the second opening;
    a conductive layer formed by covering at least an inner wall surface of the insulating layer and a bottom surface of the second opening, at an inner side of the insulating layer;
    a third opening formed to some point along the depth of the semiconductor substrate from the surface opposite to the active surface of the semiconductor substrate the third opening physically not contacting the active surface of the semiconductor substrate;
    a heat insulator imbedded in the third opening, the third opening being adjacent to the first opening;
    a package substrate disposed by facing the active surface of the semiconductor substrate; and
    a sealing resin layer formed in a clearance between a peripheral portion of the first electronic circuit on the semiconductor substrate and the package substrate, so as to hermetically seal the first electronic circuit.

2. A semiconductor device comprising:
    a heat-insulating opening in a semiconductor substrate, said heat-insulating opening extending from an opposite surface of the semiconductor substrate to a bottom surface of the heat insulating opening;
    a contact opening in said semiconductor substrate configured to expose a pad electrode, said contact opening extending from said opposite surface to an active surface of the semiconductor substrate;

a first opening in the semiconductor substrate, said first opening extending from said opposite surface and terminating in the semiconductor substrate;

a second opening in the semiconductor substrate, said second opening extending from said first opening to said pad electrode, a heat insulator imbedded in said heat-insulating opening, said heat-insulating opening physically not contacting the active surface of the semiconductor substrate, wherein a portion of the semiconductor substrate separates said bottom surface from a region of the active surface, said region of the active surface being between said pad electrode and an electronic circuit.

3. The semiconductor device according to claim 2, wherein said semiconductor substrate is a silicon substrate.

4. The semiconductor device according to claim 2, wherein said electronic circuit is a photoelectric conversion circuit.

5. The semiconductor device according to claim 2, wherein a lead electrode electrically connects said pad electrode to an external connection terminal, said lead electrode extending from said opposite surface through said contact opening.

6. The semiconductor device according to claim 2, wherein a peripheral circuit is between said pad electrode and said electronic circuit.

7. The semiconductor device according to claim 6, wherein said region of the active surface is between said electronic circuit and said peripheral circuit.

8. The semiconductor device according to claim 6, wherein a heating density of the electronic circuit during operation differs from a heating density of the peripheral circuit during operation.

9. The semiconductor device according to claim 6, wherein said peripheral circuit is a phase-locked loop circuit.

10. The semiconductor device according to claim 6, wherein said peripheral circuit is an input/output circuit.

11. The semiconductor device according to claim 6, wherein said peripheral circuit is a comparator.

12. The semiconductor device according to claim 6, wherein said peripheral circuit is a counter.

13. The semiconductor device according to claim 6, wherein said peripheral circuit is a digital-to-analog converter.

14. The semiconductor device according to claim 2, wherein an insulating layer covers sidewall surfaces of the contact opening and the heat-insulating opening.

15. The semiconductor device according to claim 14, wherein said insulating layer is between said semiconductor substrate and a conductive layer, said conductive layer being between said insulating layer and a resin.

16. The semiconductor device according to claim 2, wherein a first contact hole of the contact opening extends partially into said semiconductor substrate, a second contact hole of the contact opening extending from said first contact hole to said pad electrode.

17. The semiconductor device according to claim 16, wherein said first contact hole and said heat-insulating opening extend to an approximately equal depth of said semiconductor substrate.

18. The semiconductor device according to claim 16, wherein a diameter of the second hole is smaller than any diameter of the first hole.

19. The semiconductor device according to claim 2, wherein a sealing layer separates said semiconductor substrate from a package substrate, said sealing layer encasing said pad electrode.

20. The semiconductor device according to claim 19, wherein said package substrate is a transparent substrate.

21. The semiconductor device according to claim 19, wherein a void is between said active surface and said package substrate, said electronic circuit being within said void.

22. The semiconductor device according to claim 19, wherein said sealing layer is a resin layer.

* * * * *